United States Patent
Yano et al.

(10) Patent No.: US 9,449,697 B2
(45) Date of Patent: Sep. 20, 2016

(54) SEMICONDUCTOR MEMORY DEVICE AND MANUFACTURING METHOD THEREOF

(71) Applicant: Winbond Electronics Corp., Taichung (TW)

(72) Inventors: Masaru Yano, Tokyo (JP); Pin-Yao Wang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/621,344

(22) Filed: Feb. 12, 2015

(65) Prior Publication Data

US 2015/0380092 A1 Dec. 31, 2015

(30) Foreign Application Priority Data

Jun. 30, 2014 (JP) .................................. 2014-133580

(51) Int. Cl.
| | | |
|---|---|---|
| *G11C 11/34* | (2006.01) | |
| *G11C 16/12* | (2006.01) | |
| *H01L 27/115* | (2006.01) | |
| *G11C 8/14* | (2006.01) | |

(52) U.S. Cl.
CPC ................. *G11C 16/12* (2013.01); *G11C 8/14* (2013.01); *H01L 27/11524* (2013.01)

(58) Field of Classification Search
CPC .... G11C 16/12; G11C 8/14; H01L 27/11524
USPC ............. 365/185.18, 185.17, 185.02, 185.23
See application file for complete search history.

(56) References Cited

U.S. PATENT DOCUMENTS

| | | | | | |
|---|---|---|---|---|---|
| 6,067,249 | A | * | 5/2000 | Lee .................... | G11C 16/0416 365/185.05 |
| 6,670,684 | B2 | * | 12/2003 | Ikeda ................. | H01L 27/11524 257/315 |
| 2003/0075801 | A1 | * | 4/2003 | Ikeda .................... | H01L 27/115 257/758 |
| 2005/0218460 | A1 | * | 10/2005 | Hasegawa .......... | G11C 16/0433 257/390 |
| 2007/0001213 | A1 | * | 1/2007 | Om ....................... | H01L 27/115 257/315 |
| 2007/0148973 | A1 | * | 6/2007 | Higashitani ....... | H01L 21/28123 438/689 |

(Continued)

FOREIGN PATENT DOCUMENTS

| | | |
|---|---|---|
| JP | 2006191017 | 7/2006 |
| JP | 2012028467 | 2/2012 |

(Continued)

OTHER PUBLICATIONS

"Office Action of Korean Counterpart Application with English translation", issued on Oct. 30, 2015, p. 1-p. 8.

*Primary Examiner* — Viet Q Nguyen
(74) *Attorney, Agent, or Firm* — Jianq Chyun IP Office (57) ABSTRACT

A semiconductor memory device is provided, which can suppress current leakage generated during a programming action so that the programming action can be executed with high reliability. A flash memory of this invention has a memory array in which NAND type strings are formed. Gates of memory cells in row direction of strings are commonly connected to a word line. Gates of bit line select transistors are commonly connected to a select gate line (SGD). Gates of source line select transistors are commonly connected to a select gate line (SGS). An interval (S4) of the select gate line (SGS) and a gate of a word line (WL0) adjacent to the select gate line (SGS) is larger than an interval (S1) of the select gate line (SGD) and a gate of a word line (WL7) adjacent to the select gate line (SGD).

5 Claims, 13 Drawing Sheets

(56) References Cited

U.S. PATENT DOCUMENTS

| | | | |
|---|---|---|---|
| 2007/0210372 A1* | 9/2007 | Park | H01L 27/115 257/321 |
| 2007/0236992 A1* | 10/2007 | Oowada | G11C 16/0483 365/185.02 |
| 2007/0253253 A1* | 11/2007 | Aritome | G11C 16/0483 365/185.17 |
| 2009/0027964 A1* | 1/2009 | Arai | G11C 8/14 365/185.05 |
| 2010/0224927 A1* | 9/2010 | Ishihara | H01L 27/11521 257/324 |
| 2013/0062680 A1* | 3/2013 | Kato | H01L 29/66825 257/316 |

FOREIGN PATENT DOCUMENTS

| | | |
|---|---|---|
| JP | 5030131 | 9/2012 |
| JP | 2012190501 | 10/2012 |
| KR | 1020070002399 | 1/2007 |

* cited by examiner

Cross-sectional diagram along line A-A

FIG. 4

Cross-sectional diagram along line A-A

Cross-sectional diagram along line A-A

SEMICONDUCTOR MEMORY DEVICE AND MANUFACTURING METHOD THEREOF

CROSS-REFERENCE TO RELATED APPLICATION

This application claims the priority benefit of Japan application serial no. 2014-133580, filed on Jun. 30, 2014. The entirety of the above-mentioned patent application is hereby incorporated by reference herein and made a part of this specification.

BACKGROUND OF THE INVENTION

1. Field of the Invention

The invention relates to a flash memory having a NAND (Not AND) type memory cell, and more particularly, relates to a layout structure and a programming of a memory array.

2. Description of Related Art

A NAND type flash memory has a memory cell array in which NAND type strings are formed by a plurality of memory cells connected in series. A typical NAND string includes: a plurality of memory cells connected in series; a bit line select transistor, connected to one end portion of the memory cells in series; and a source line select transistor, connected to another end portion of the memory cells in series. A drain of the bit line select transistor is connected to a bit line, and a source of the source line select transistor is connected to a source line. The bit line select transistor and the source line select transistor are selectively driven through a select gate line during reading, programming or erasing actions (Patent Document 1).

Patent Document 1: Japanese Patent Publication Number 2012-190501.

SUMMARY OF THE INVENTION

Figure 1:
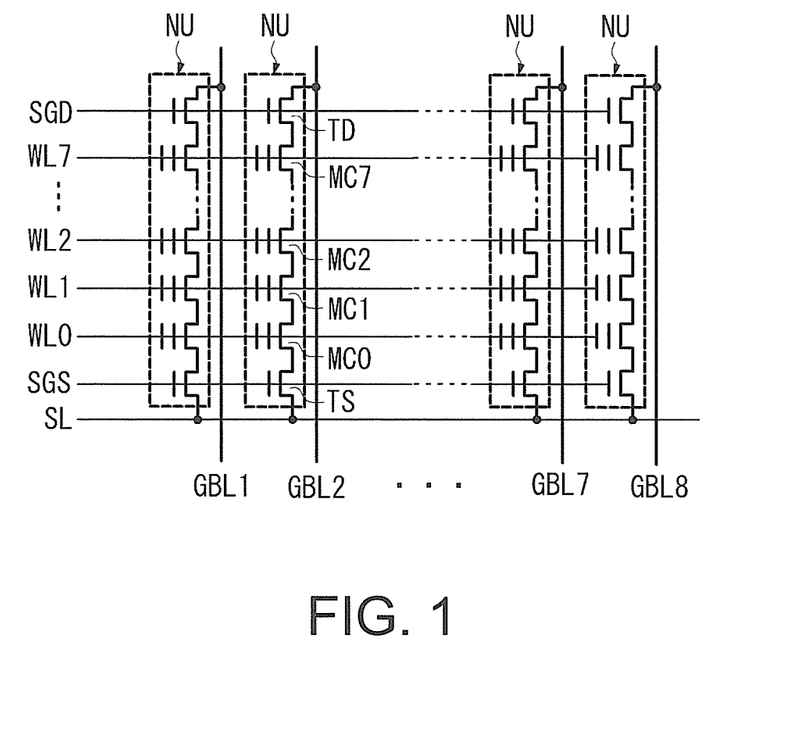
FIG. 1 is a schematic circuit diagram illustrating a structure of NAND strings of a flash memory.

FIG. 1 illustrates a circuit structure of NAND strings of a flash memory. In FIG. 1, n NAND strings NU (for example: eight NAND strings) are arranged along row direction in one memory block. Each NAND string NU includes, for example, eight memory cells MCi (i=0, 1, ..., 7), a bit line select transistor TD connected at a drain side of the memory cell MC7, and a source line select transistor TS connected at a source side of the memory cell MC0. A drain of the bit line select transistor TD is connected to a corresponding global bit line GBL, and a source of the source line select transistor TS is connected to a common source line SL.

Figure 2:
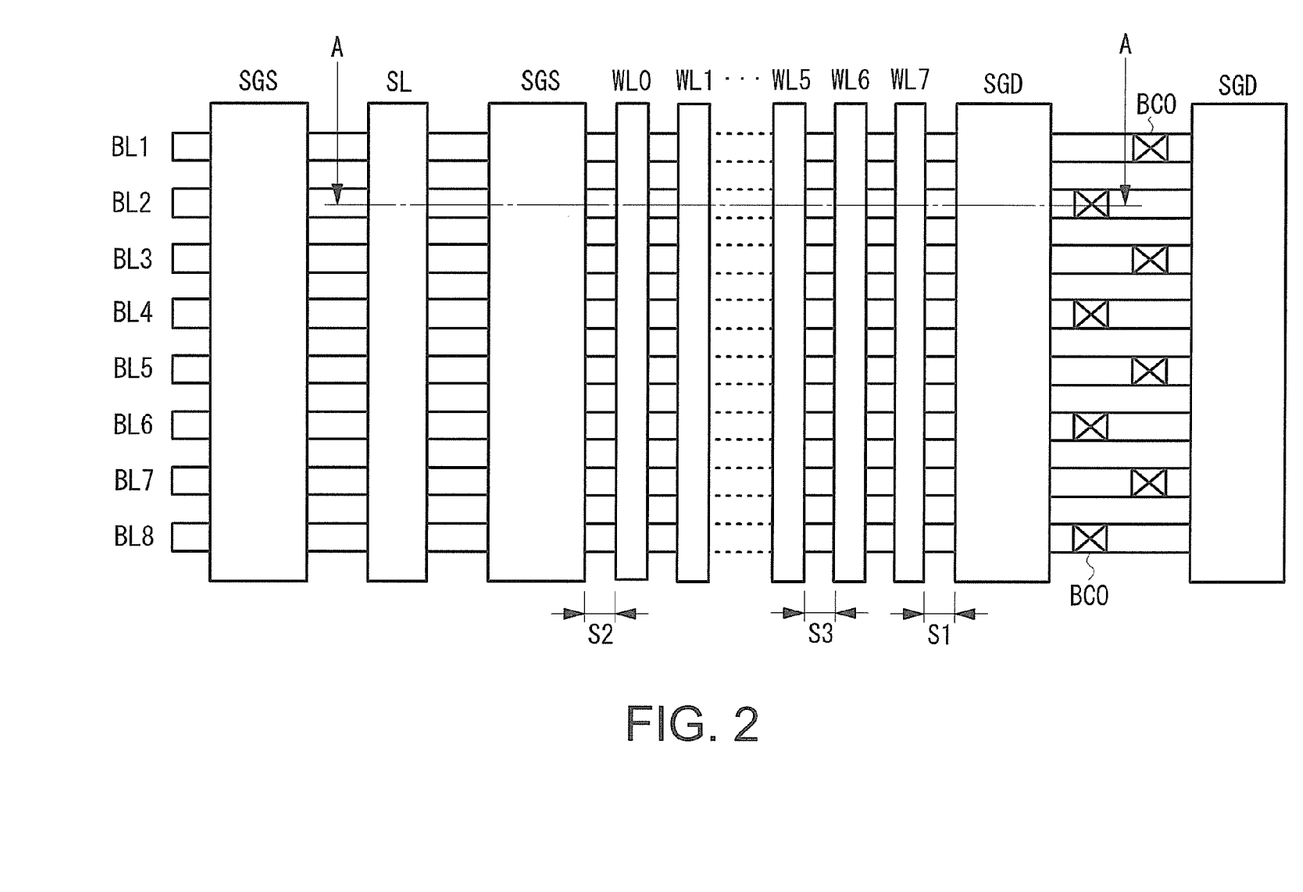
FIG. 2 is a two-dimensional diagram illustrating a schematic layout of a memory array of the flash memory in conventional art.
Figure 3:
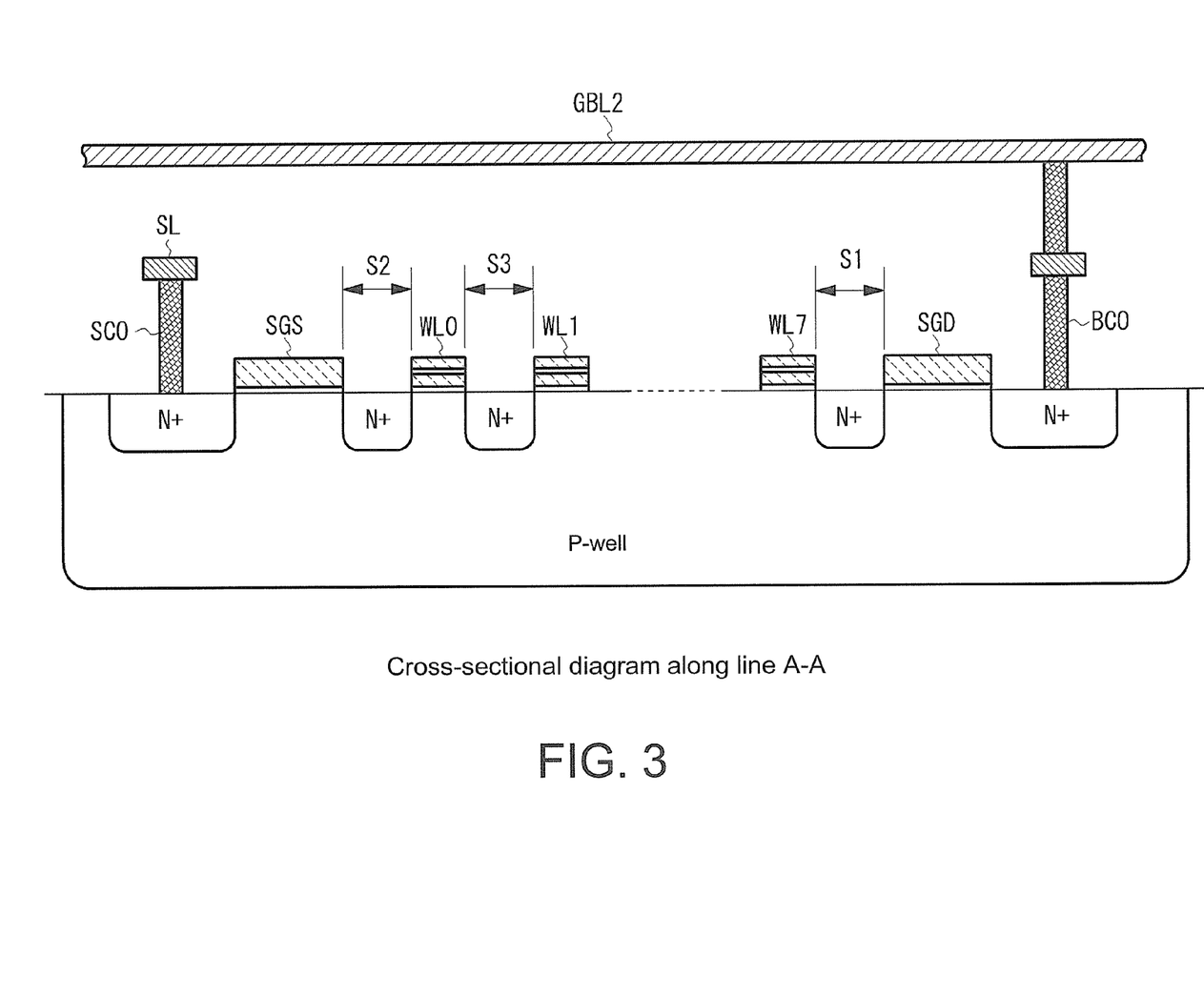
FIG. 3 is a schematic cross-sectional view of FIG. 2 along a line A-A.

FIG. 2 is a schematic layout of one memory block in a memory array, and FIG. 3 is a schematic cross-sectional view of FIG. 2 along a line A-A. A plurality of NAND strings formed in a P-well are arranged along a direction from BL1, BL2 to BL8, and the NAND strings are respectively connected to each of global bit lines GBL1 to GBL8 (which are omitted in FIG. 2) through bit line contacts BCO. Each of floating gates (which are omitted in FIGS. 2 and 3) of the memory cells of the NAND strings in row direction are commonly connected through word lines WL0 to WL7 which are also used as control gates. The floating gate of each memory cell and the word lines WL0 to WL7 are constituted by, for example, a conductive ploy-silicon layer, and each of the word lines WL0 to WL7 extends within the memory array in parallel to one another. When each of the word lines is patterned, the floating gate located thereunder is also patterned, such that a length of the gate of the memory cell is substantially equal to a width of the word line.

Gates of the bit line select transistors TD in row direction are commonly connected to a select gate line SGD. Similarly, gates of the source line select transistors TS are commonly connected to a select gate line SGS. The select gate lines SGD and SGS are constituted by, for example, a conductive ploy-silicon layer. The select gate line SGD extends in parallel to the word line WL7, and the select gate line SGS extends in parallel to the word line WL0. As shown in FIG. 3, the global bit line GBL2 is connected to a diffusion region of the bit line select transistor through the bit line contact BCO, and the common source line SL is connected to a diffusion region of the source line select transistor through a source line contact SCO. The source line SL and the global bit line GBL are constituted by, for example, a conductive ploy-silicon layer or a metal layer.

An interval of the select gate line SGD and the word line WL7 (an interval of the gate of the bit line select transistor and the gate of the memory cell MC7) is S1, an interval of the select gate line SGS and the word line WL0 (the gate of the source line select transistor and the gate of the memory cell MC0) is S2, and an interval between each of the word lines (an interval of the memory cells in a NAND strings direction) is S3. In order to perform a microfabrication with high precision, it is preferable that the intervals satisfies S1=S2=S3 and the layout of the NAND strings in the block is substantially symmetric.

When a programming action is executed, a programming voltage of 18 V to 20 V is applied to a selected page, and a pass voltage of 8 V to 9 V is applied to a non-selected page, for example. 0 V is applied to the select gate line SGS and 1.5 V is applied to the select gate line SGD as a circuit voltage Vcc, for example. 0 V is applied to a bit line including a selected memory cell to be programmed (hereinafter, referring to as a selected bit line), and Vcc or 1.5 V is applied to a bit line including a non-selected memory cell not to be programmed (hereinafter, referring to as a non-selected bit line). As such, a channel potential of the selected memory cell is grounded to be 0 V, and, as in response to application of the programming voltage and the pass voltage after the bit line select transistor is switched off, a channel potential of the non-selected memory cell self boosts to, for example, 7 V to 8 V through a capacity coupling between the word line and the channel. Accordingly, the selected memory cell is injected with the electrons through a FN tunneling mechanism, whereas the non-selected memory cell is not injected with the electrons.

Figure 4:
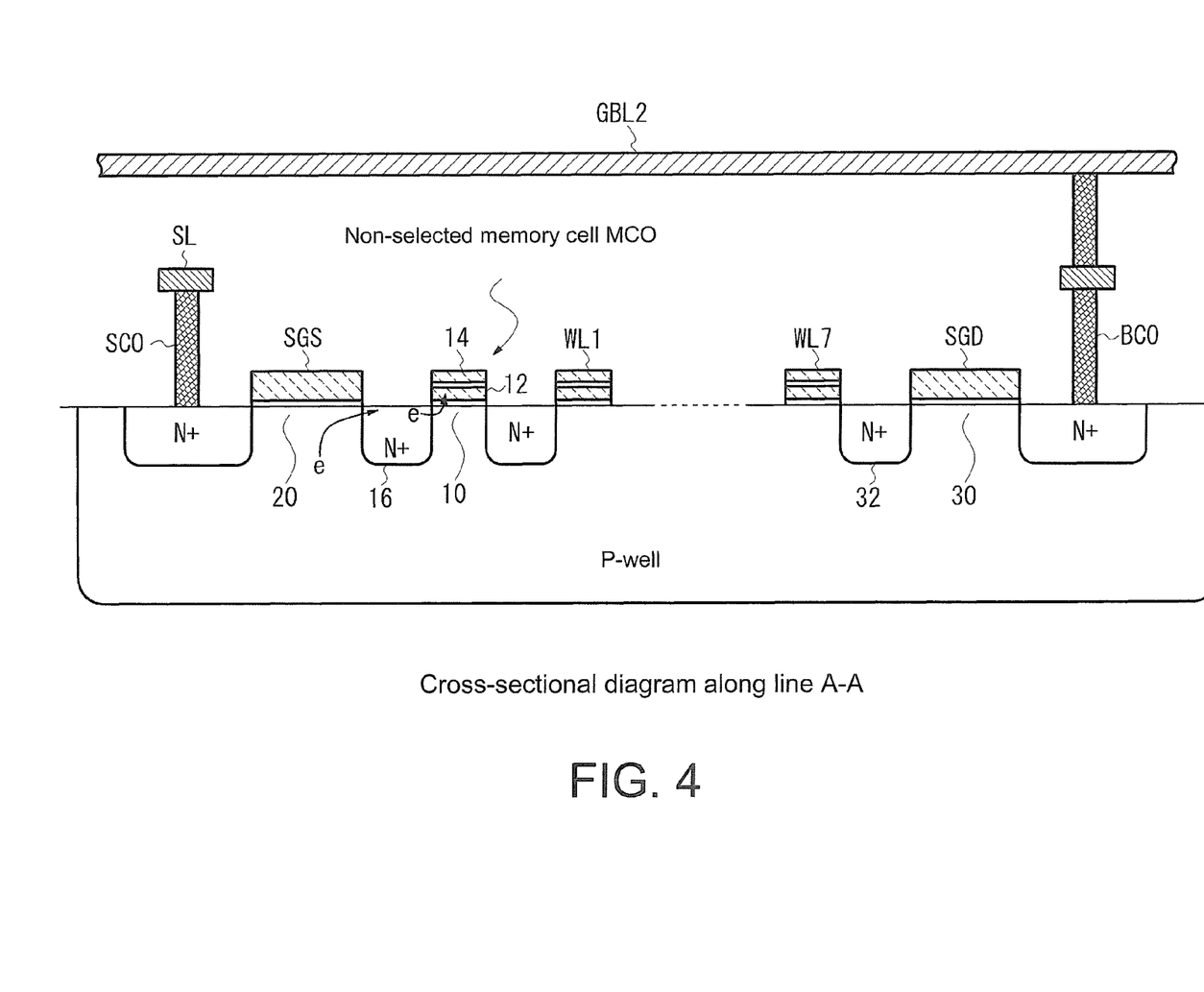
FIG. 4 is a diagram illustrating current leakage of the non-selected memory cell during a programming action of the flash memory in conventional art.

With advancement in semiconductor processing technology, when the intervals S1 and S2 are respectively reduced to a nano order, an issue of current leakage caused by Gate Induced Drain Leakage (GIDL) becomes not negligible. Herein, it is assumed that the word line WL0 is the selected page. In this case, the channel potential of the selected memory cell MC0 is 0 V, and the channel potential of the non-selected memory cell MC0 is 7 V to 8 V. FIG. 4 illustrates a situation of the non-selected memory cell MC0. The programming voltage of 18 V to 20 V is applied to the word line WL0 of the non-selected memory cell MC0 (i.e., a control gate 14). However, because the potential of a channel 10 of the non-selected memory cell MC0 self boosts to 7 V to 8 V, a potential difference between the channel 10 and a floating gate 12 is not sufficient for the electrons to be injected through a FN tunneling mechanism.

The channel 10 and a N+ diffusion region 16 of the non-selected memory cell MC0 are boosted to a relatively higher voltage, such that certain depletion region(s) is/are formed near the channel 10 and the diffusion region 16. Since 0 V is applied to the select gate line SGS, almost none of the depletion regions is formed in a channel 20 under the select gate line SGS. As such, the electrons passed through the channel 20 are attracted to the diffusion region 16 having the relatively higher voltage and then enter the diffusion region 16. If the interval S2 is extremely narrow (i.e., if the width of the diffusion region 16 is short), the electrons entered the diffusion region 16 can penetrate a gate insulation film to be injected into the floating gate 12 of the non-selected memory cell MC0. As a result, a variation may occur on a threshold of the non-selected memory cell MC0 not meant to be programmed.

On the other hand, the issue caused by GIDL may also occur in the circumstance where the programming action is executed on the word line WL7 adjacent to the bit line select transistor TD. Because the voltage of, for example, 1.5 V is applied to the select gate line SGD, an inversion layer or certain depletion region(s) is/are formed in a channel 30 under the select gate line SGD. Therefore, in the circumstance where an amount of the electrons passed through the channel 30 and injected into a diffusion region 32 is less than that of the source line select transistor, a variation on the threshold of the non-selected memory cell MC7 is not as large as that of the non-selected memory cell MC0.

Although a dummy word line (a dummy unit) may be disposed at locations respectively adjacent to the source line select transistor and the bit line select transistor to serve as a solution for the issue caused by GIDL, however, the layout of the memory array may become larger and lead to a larger chip size.

The purpose of the invention is to solve such issue in conventional art by providing a semiconductor memory device, which can suppress current leakage generated during a programming action so that the programming action can be executed with high reliability.

The invention provides a semiconductor memory device including a memory array, and the memory array includes: a plurality of NAND type strings, wherein each of the strings includes: a plurality of memory cells connected in series; a bit line select transistor, connected to one end portion of the memory cells connected in series; and a source line select transistor, connected to another end portion of the memory cells connected in series; a plurality of word lines, connected to a plurality of gates of the memory cells in row direction of the strings; a first select gate line, connected to a plurality of gates of the source line select transistors in row direction of the strings; and a second select gate line, connected to a plurality of gates of the bit line select transistors in row direction of the strings; wherein in any one string among the strings, a first interval is greater than a second interval, the first interval is an interval between the gate of the source line select transistor and the gate of the memory cell of the word line adjacent thereto, and the second interval is an interval between the gate of the bit line select transistor and the gate of the memory cell of the word line adjacent thereto.

The invention further provides a manufacturing method of a semiconductor memory device. The device includes a memory array having a plurality of NAND type strings, and the manufacturing method includes: a step of forming a hard mask on a processed film constituting a gate of a memory cell; a step of forming a plurality of photoresist patterns on the hard mask; a step of forming a spacer layer on sidewalls of the photoresist patterns; a step of removing the photoresist patterns; a step of using the remained spacer layer as a mask to etch the hard mask; and a step of using the hard mask as a mask to etch the processed film to form the gate of the memory cell, wherein the memory array has an asymmetric structure in which a first interval is greater than a second interval, the first interval is an interval between a gate of a source line select transistor and the gate of the memory cell adjacent thereto, and the second interval is an interval between a gate of a bit line select transistor and the gate of the memory cell adjacent thereto.

The invention further provides a manufacturing method of a semiconductor memory device. The device includes a memory array having a plurality of NAND type strings, and the manufacturing method includes: a step of forming a plurality of photoresist patterns on a processed film constituting a gate of a memory cell; a step of forming an insulation layer on an entire surface containing the photoresist patterns; a step of forming a photoresist layer on the insulation layer; a step of etching the photoresist layer in a manner of remaining the photoresist layer on sidewalls at two sides of the insulation layer; a step of removing the insulation layer; a step of using the photoresist patterns and the remained photoresist layer as a mask to etch the processed film to form a plurality of gates; and a step of removing the photoresist patterns and the remained photoresist layer, wherein the memory array has an asymmetric structure in which a first interval is greater than a second interval, the first interval is an interval between a gate of a source line select transistor and the gate of the memory cell adjacent thereto, and the second interval is an interval between a gate of a bit line select transistor and the gate of the memory cell adjacent thereto.

In summary, the invention is capable of suppressing the variation on the threshold of the non-selected memory cell resulting from current leakage caused by GIDL during the programming action. Further, when the word line adjacent to the bit line select transistor is selected, occurrence of the variation on the threshold of the non-selected memory cell may also be suppressed by enlarging the voltage of the select gate line of the bit line select transistor. As a result, current leakage caused by GIDL may be suppressed simply by enlarging one of the first intervals in the memory array, so as to restrain the layout or the chip of the memory array from being larger.

DESCRIPTION OF THE EMBODIMENTS

Embodiments of the invention are described in detail below by reference with accompanied figures. In addition, it is worth to note that parts of the accompanied figures are exaggerated to emphasize on certain features to make it more apparent for understanding, and the proportion thereof is different from the real devices.

Figure 5:
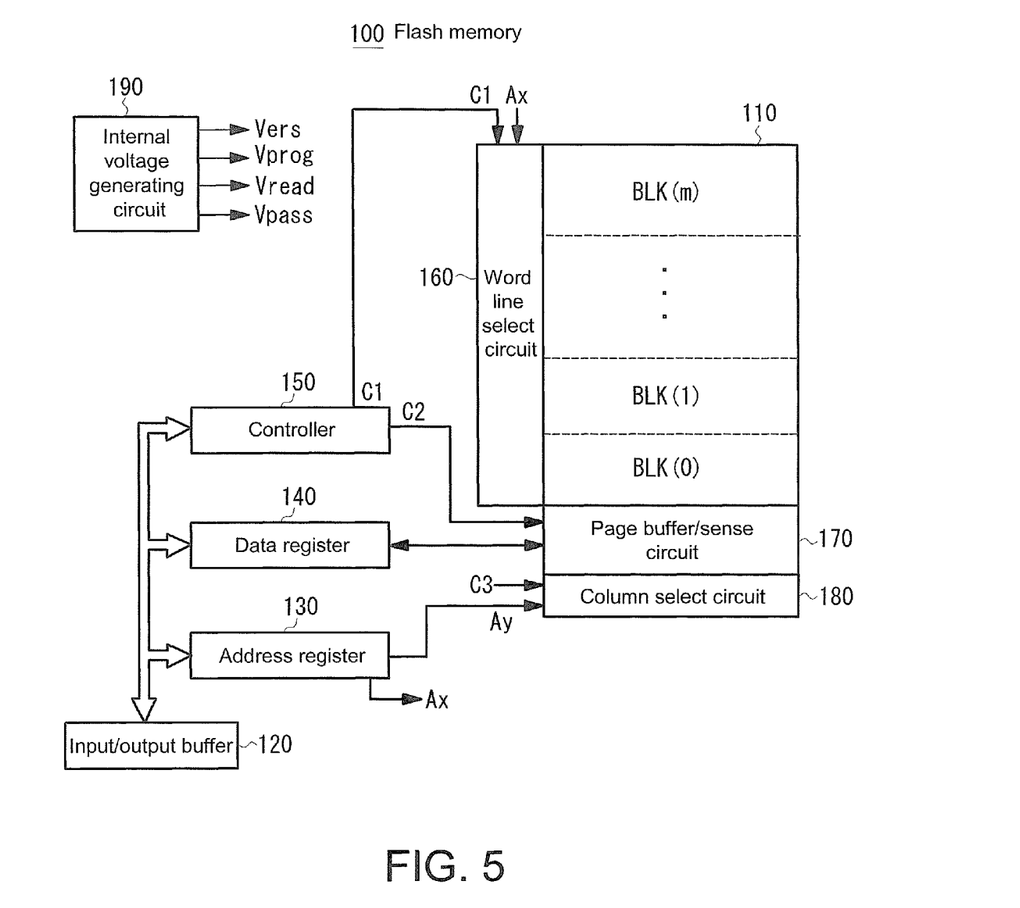
FIG. 5 is a block diagram illustrating a structure of a flash memory according to an exemplary embodiment of the invention.

FIG. 5 is a block diagram illustrating a structure of a NAND type flash memory according to an exemplary embodiment of the invention. A flash memory 100 of the present embodiment includes: a memory array 110 in which a plurality of memory cells arranged in rows and columns are formed; an input/output buffer 120, connected to an external input/output terminal I/O, and retaining input/output data; an address register 130, receiving address data from the input/output buffer 120; a data register 140, retaining input/output data; a controller 150, providing control signals C1, C2 and C3, and the control signals C1, C2 and C3 controlling each part based on command data from the input/output buffer 120 and an external control signal (e.g., a chip enable or an address latch enable, which are not illustrated); a word line select circuit 160, performing a decoding operation on row address information Ax from the address register 130, and performing a block selection and a word line selection based on a decoding result; a page buffer/sense circuit 170, retaining data read through the bit line, or retaining programming data through the bit line; a column select circuit 180, performing a decoding operation on column address information Ay from the address register 130, and performing a bit line selection based on a decoding result; and an internal voltage generating circuit 190, generating voltages required for reading, programming and erasing the data (e.g., a programming voltage Vprog, a pass voltage Vpass, a reading voltage Vread, an erasing voltage Vers, etc.).

The memory array 110 has a plurality of blocks BLK(0), BLK(1), . . . , BLK(m) which are disposed along column direction. The page buffer/sense circuit 170 is disposed on one end portion of the blocks. Nonetheless, the page buffer/sense circuit 170 may also be disposed on another end portion of the blocks, or on both end portions at two sides. In one memory block, as shown in the FIG. 1, a plurality of NAND strings NU is formed. The memory cell typically includes a MOS (Metal Oxide Semiconductor) structure, and the MOS structure includes: source/drain, served as a N-type diffusion region and formed inside a P-well; a tunneling oxide film, formed on a channel between the source/drain; a floating gate (a charge accumulation layer), formed on the tunneling oxide film; and a control gate, formed on the floating gate with a dielectric film interposed therebetween. When the charges are not accumulated in the floating gate (i.e., writing data "1"), a threshold is in a negative state, and the memory cells are normally on. When the electrons are accumulated in the floating gate (i.e., writing data "0"), the threshold shifts to a positive state, and the memory cells are normally off.

Figure 6:
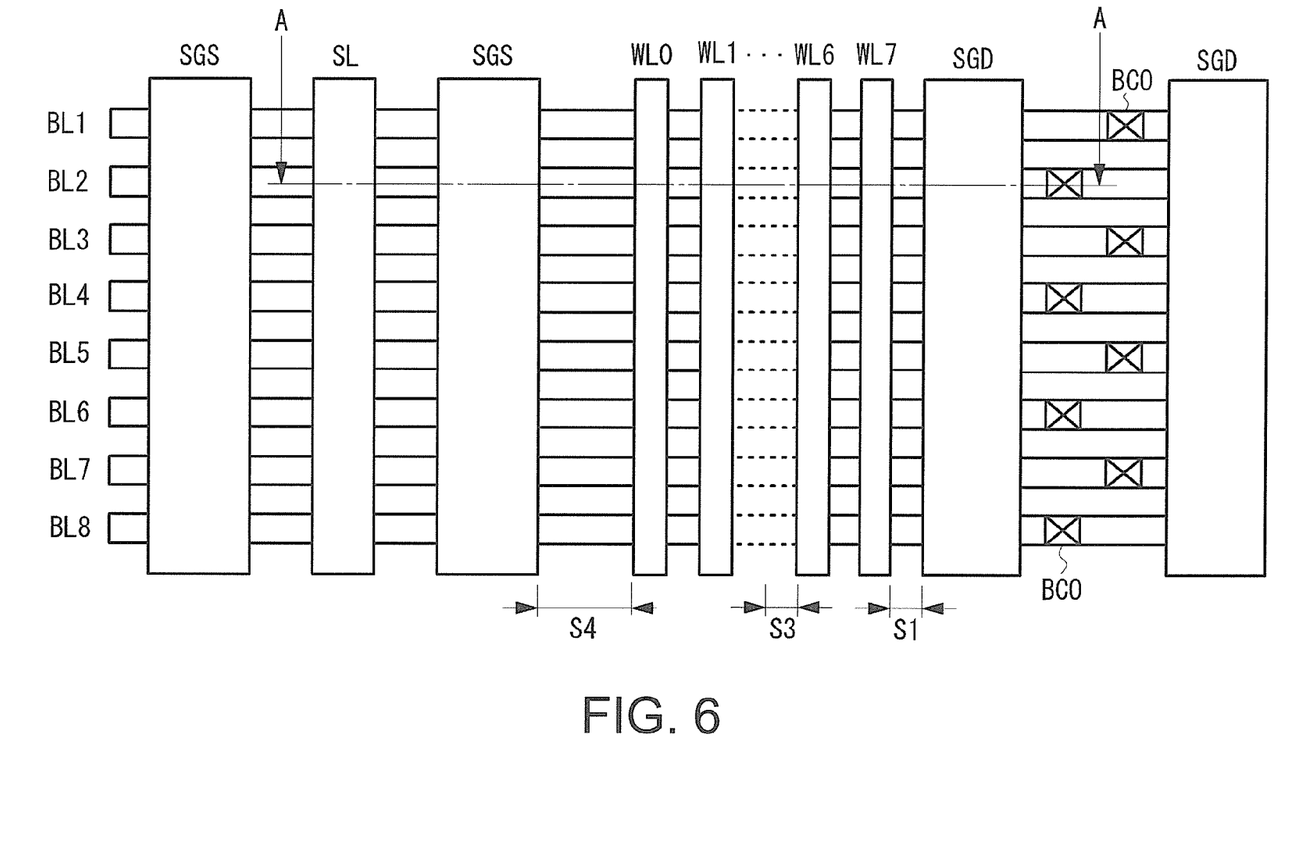
FIG. 6 is a two-dimensional diagram illustrating a schematic layout of a memory array of the flash memory according to an embodiment of the invention.
Figure 7:
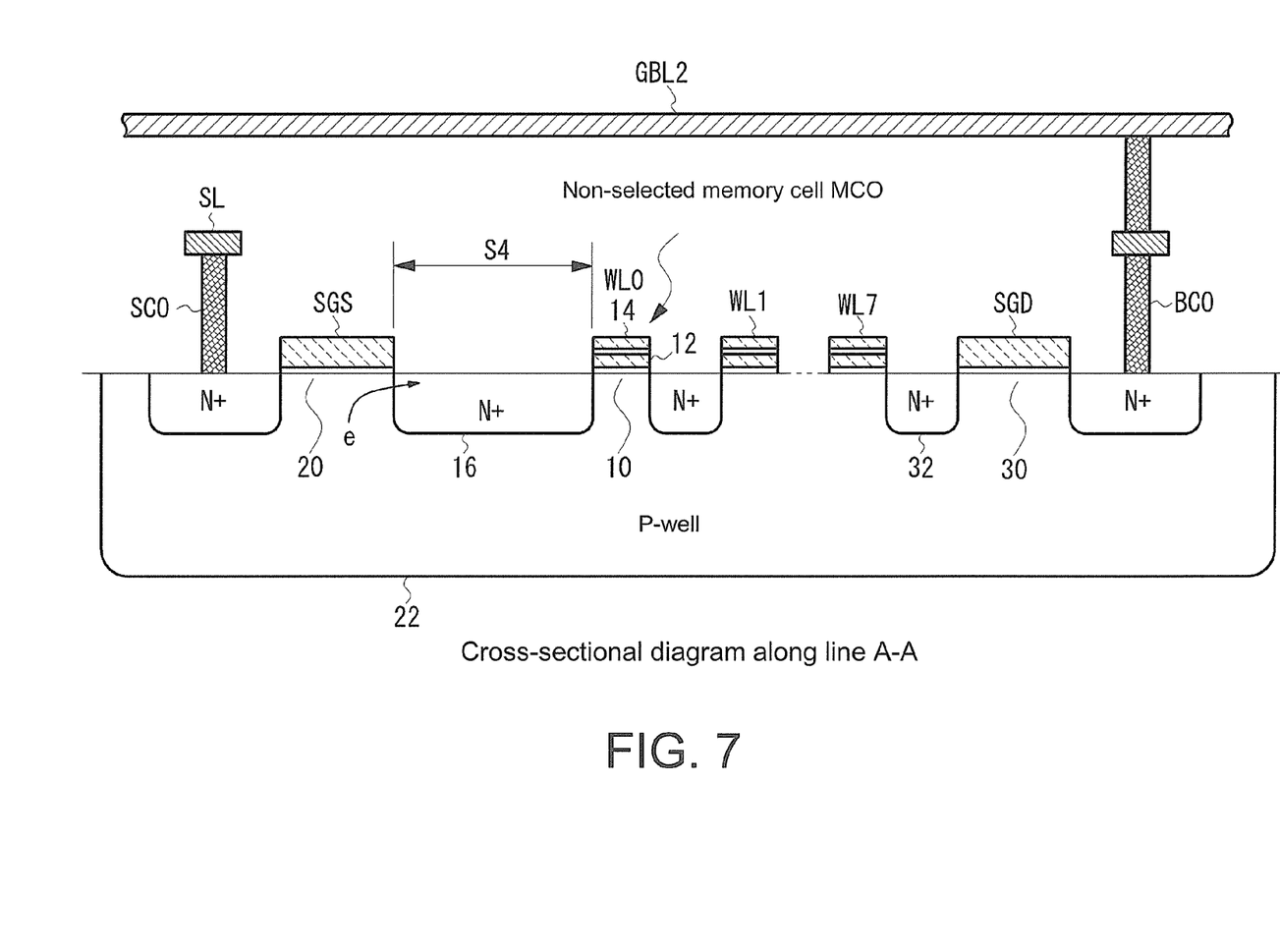
FIG. 7 is a schematic cross-sectional view of FIG. 6 along a line A-A.

FIG. 6 is a schematic layout of a memory array according to the present embodiment, and FIG. 7 is a cross-sectional view of FIG. 6 along a line A-A. Voltages applied to each part during operations of the flash memory according to an embodiment of the invention are listed in Table 1 below.

TABLE 1

| | Erasing | Writing | Reading |
|---|---|---|---|
| Selected W/L | 0 | 15~20 V | Vx |
| Non-selected W/L | F | 10 V | 4.5 |
| SGD | F | Vcc | 4.5 |
| SGS | F | 0 | 4.5 |
| SL | F | Vcc~ | 0 |
| P-well | 21 | 0 | 0 |

The memory array of the present embodiment is as shown in FIG. 6, and the word line WL0 adjacent to the select gate line SGS of the source line select transistor is substantially far away from the select gate line SGS. That is, an interval S4 between a gate of the source line select transistor and the floating gate of the memory cell MC0 connected to the word line WL0 is greater than the interval S2 shown in FIG. 2 of conventional art (S4>S2). It is preferable that S4=2×S1 and S1=S3.

During a programming action, when the word line WL0 adjacent to the select gate line SGS is the selected page, the programming voltage is applied to the word line WL0. A situation of the non-selected memory cell MC0 at the time is shown in FIG. 7. 0 V is provided to the selected bit line and 1.5 V is provided to the non-selected bit line for example, and a voltage being, for example, 1.5 V or greater than 1.5 V is applied to the select gate line SGD of the bit line select transistor. Accordingly, the channel potential of the selected memory cell is 0 V, and the potential of the channel 10 of the non-selected memory cell MC0 boosts to 7 V to 8 V.

Because the potential of the N+ diffusion region 16 also boosts together with the channel 10, the depletion region(s) is/are formed near the N+ diffusion region 16. 0 V is applied to the select gate line SGS, so that almost none of the depletion regions is formed in the channel 20 under the select gate line SGS. Therefore, the electrons passed through the channel 20 enters the diffusion region 16 having high voltage. However, because the width of the diffusion region 16 (i.e., the interval S4 of the select gated line SGS and the floating gate of the memory cell MC0) is sufficiently large, the electrons entered the diffusion region 16 may lose energy during a traveling process in the diffusion region 16, and thus the electrons cannot easily penetrate the gate insulation film.

As described above, according to the present embodiment, by making the memory cell adjacent to the source line select transistor far away from the source line select transistor, an injection of the electrons towards the floating gate 12 of the non-selected memory cell MC0 caused by GIDL during the programming action may be suppressed, such that the undesired variation on the threshold of the non-selected memory cell MC0 may also be suppressed.

Next, a second embodiment of the invention is described below. In the first embodiment, a method for suppressing the variation on the threshold of the memory cell at the source select transistor side caused by GIDL is illustrated. On the other hand, the second embodiment relates to a method for suppressing the variation on the threshold of the memory cell at the bit line select transistor side caused by GIDL.

It is required that a voltage VSGD applied to the select gate line SGD is large enough to turn on the bit line select transistor. For example, when a voltage provided to the non-selected bit line is Vb, the voltage VSGD is a value greater than Vb+Vth (Vth is a threshold of the bit line select transistor).

In the present embodiment, by making the voltage VSGD applied to the select gate line SGD of the bit line select transistor greater than the previous value, the inversion layer and the depletion region may be sufficiently formed at the channel 30 under the select gate line SGD. Accordingly, it is difficult for the electrons in a P-well region 22 to pass through the channel 30 and enter into a diffusion region 32. As a result, the variation occurred on the threshold of the non-selected memory cell MC7 is suppressed.

Figure 8:
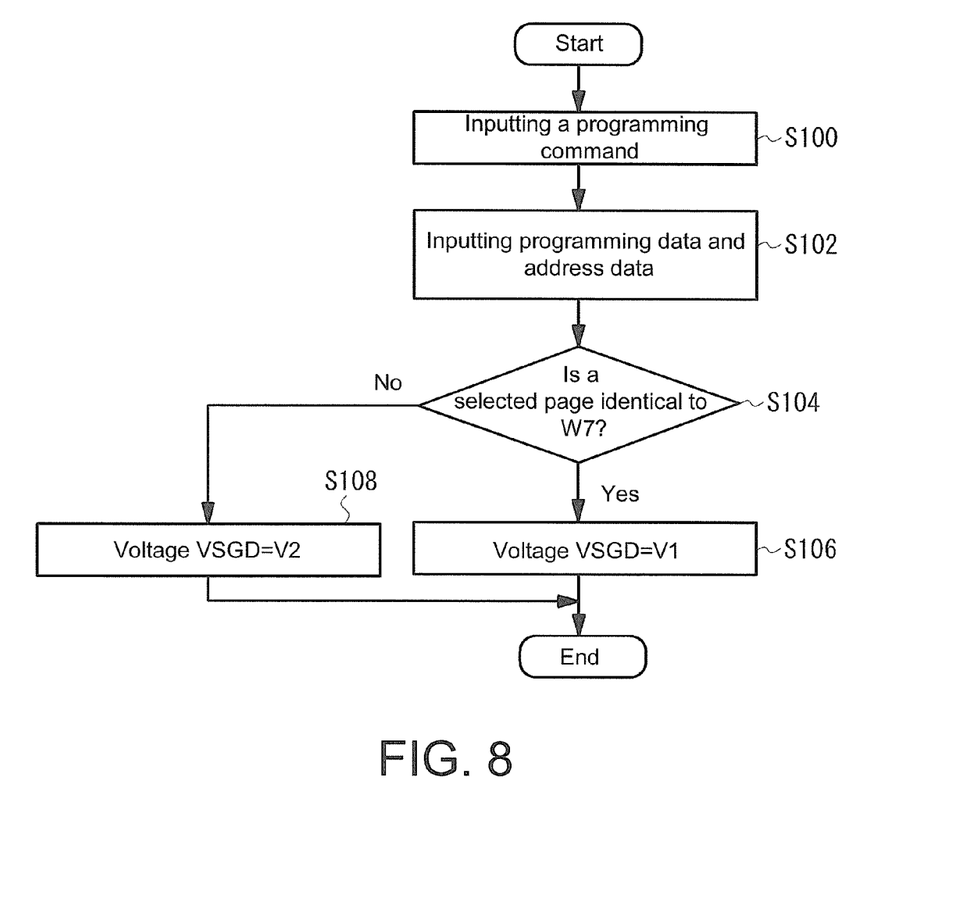
FIG. 8 is a flowchart illustrating the programming action according to a second embodiment of the invention.

In a preferred implementation of the second embodiment, when the word line WL7 adjacent to the select gate line SGD is the selected page, the voltage VSGD of the select gate line SGD may also be enlarged. FIG. 8 illustrates a flowchart for performing aforesaid action. When a programming command is inputted from an external host (S100), the controller 150 starts a sequence of initiating the programming action. Subsequently, when programming data and address data are inputted from the external host (S102), the controller 150 determines whether a page to be programmed is equivalent to a page adjacent to the bit line select transistor (the word line WL7 in the example of FIG. 7) (S104). If so, the word line select transistor 160 is controlled in a manner of the voltage of the select gate line SGD (VSGD)=V1 (S106); and if not, the word line select transistor 160 is controlled in a manner of the voltage VSGD=V2 (S108). Herein, a relation of the voltages is V1>V2 (e.g., V1=3.0 V and V2=1.5 V).

Accordingly, the undesired variation on the threshold of the non-selected memory cell at the bit line select transistor side caused by GIDL can be suppressed.

Next, a manufacturing method of a memory array with an asymmetric structure according to a third embodiment of the invention is illustrated in FIG. 9A to FIG. 9E. These cross-sectional views are schematic cross-sectional views in a bit line direction shown in FIG. 6 (the NAND strings direction). In a preferred implementation, the memory array of the present embodiment is manufactured by using a double patterning technique.

Figure 9A:
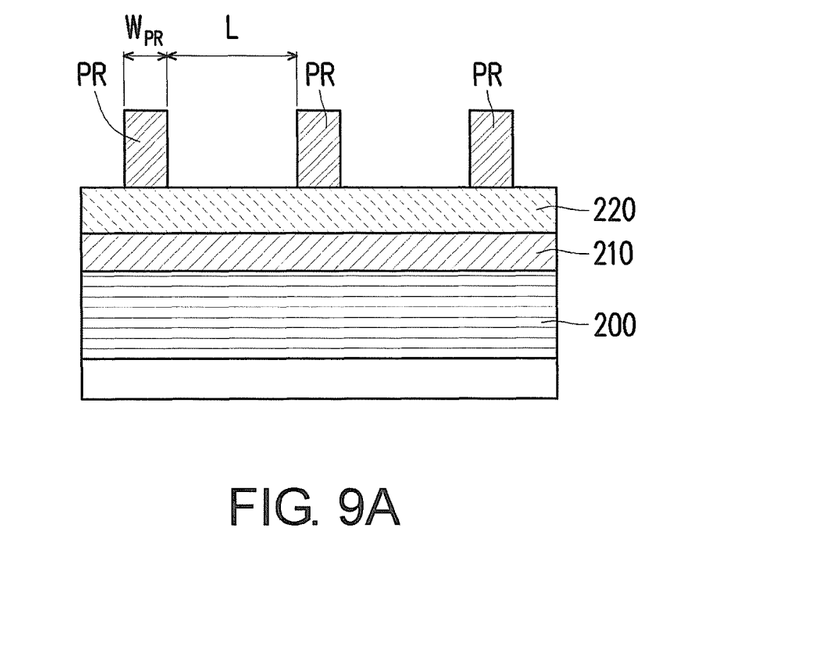
FIG. 9A to FIG. 9E are diagrams illustrating a manufacturing method of an asymmetric memory array according to a third embodiment of the invention.

First, as shown in FIG. 9A, a hard mask 210 and an underlayer film 220 is formed on a processed layer 200, and photoresist patterns PR are formed on the underlayer film 220. The photoresist patterns PR have a width $W_{PR}$ and are formed with a fixed interval L. Herein, a preferable condition is that, for example, a ratio of the width $W_{PR}$ to the interval L is 1:3. The hard mask 210 and the underlayer film 220 are constituted by, for example, insulation films such as $SiO_2$ or $Si_3N_4$. In other implementations, the underlayer film 220 may be constituted by a material identical to the hard mask 210. Herein, the processed layer 200 constitutes the gates (the floating gate and the control gate) of the memory cells, and is, for example, constituted by a ploy-silicon layer. In addition, although it is not illustrated, the gate of the memory cell may be manufactured together with gates of the source line select transistor and a drain line select transistor at the same time.

Figure 9B:
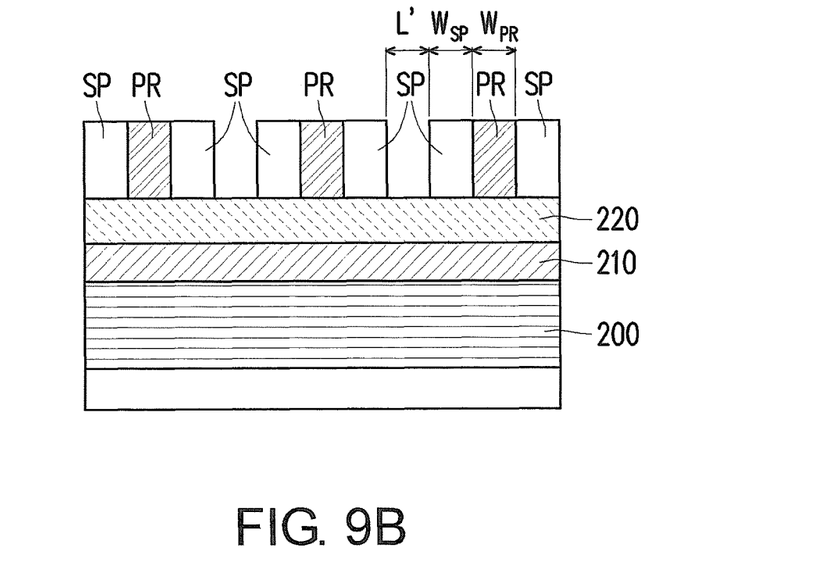

Next, after an insulation film (e.g., $SiO_2$ with a fixed film thickness) is formed on the underlayer film 220 and the photoresist patterns PR, the insulation film is flattened by an etch back process. Accordingly, as shown in FIG. 9B, spacer layers SP are formed on sidewalls at two sides of the photoresist patterns PR. Specifically, after the insulation film (e.g., $SiO_2$ with the fixed film thickness) is formed on the underlayer film 220 and the photoresist patterns PR, the insulation film is flattened by using, for example, an anisotropic etching method such as a dry etching (e.g., an etching method in which an etching rate in an up and down direction of FIG. 9A is greater than an etching rate in a left and right direction) to perform an etch back process, and then the insulation film faulted on the sidewalls of the photoresist patterns PR are remained to form the spacer layers SP. A width $W_{SP}$ of the spacer layer SP may be properly selected according to etching conditions. Herein, a preferable condition is, for example, a ratio of the width $W_{PR}$ to the width $W_{SP}$ is 1:1.

Figure 9C:
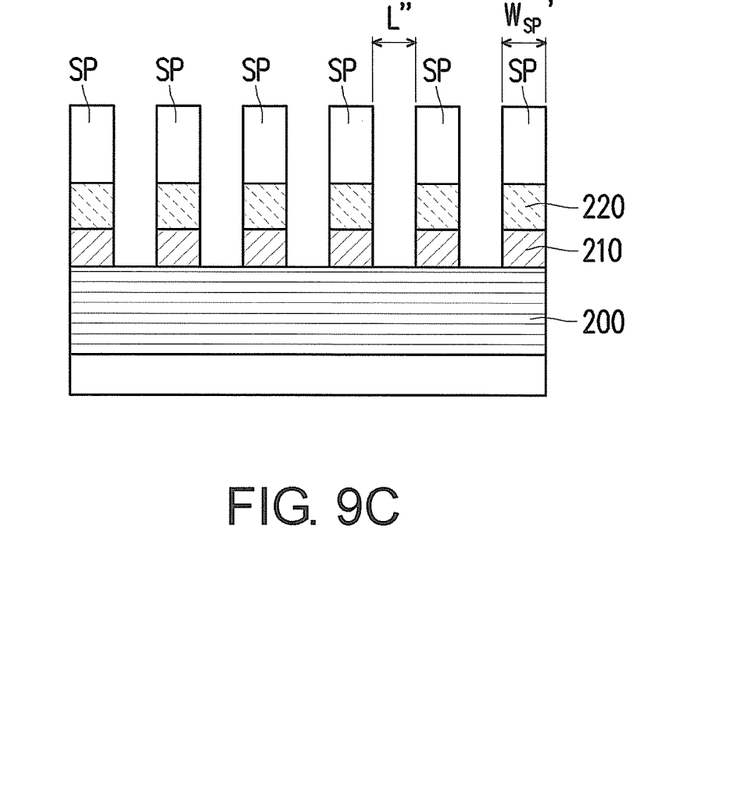

Next, as shown in FIG. 9C, after the photoresist patterns PR are removed through methods such as ashing, the spacers SP may then be used as a mask to etch the underlayer film 220 and the hard mask 210. Because the spacer layers SP are also partially etched while etching the underlayer film 220 and the hard mask 210, a width $W_{SP}'$ of the etched spacer layer SP is less than the original width $W_{SP}$. Similarly, after using the spacer layers SP as the mask for etching the underlayer film 220 and the hard mask 210, widths of the etched underlayer film 220 and the etched hard mask 210 are correspondingly less than the width $W_{SP}$ of the original spacer layer and approximately equal to the width $W_{SP}'$ of the etched spacer layer.

Figure 9D:
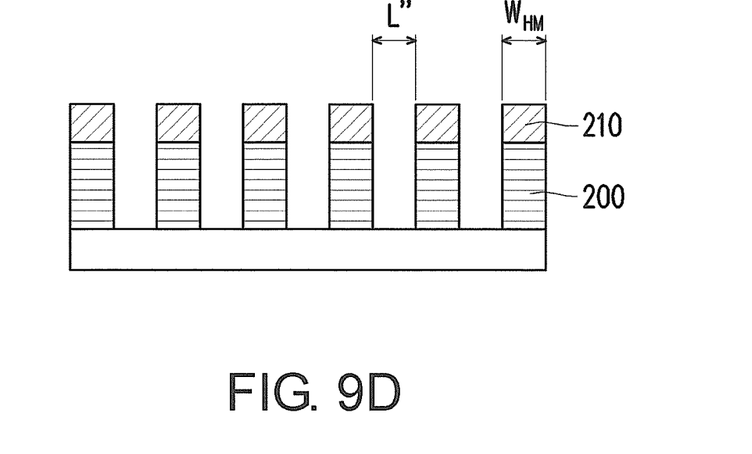

Subsequently, as shown in 9(D), an etchant that has poor etching rate for the hard mask 210 and the processed layer 200 is used to remove the spacer layers SP and the underlayer film 220, so as to obtain the patterned hard mask 210, and the hard mask 210 has a width $W_{HM}$. In the present embodiment, the width $W_{HM}$ equal to the width $W_{SP}'$ is slightly less than the width $W_{SP}$, and an interval L" between the hard masks 210 is slightly greater than the interval L' between the spacer layers shown in FIG. 9B. In other words, by using the etching conditions to adjust the width $W_{PR}$ of the photoresist patterns PR, the intervals L' and L", the widths $W_{SP}$ and $W_{SP}'$ of the spacer layers SP and the like, the width $W_{HM}$ of the hard mask 210 may be set to, for example, $W_{HM}=\frac{1}{2}W_{PR}$ or any other values.

Figure 9E:
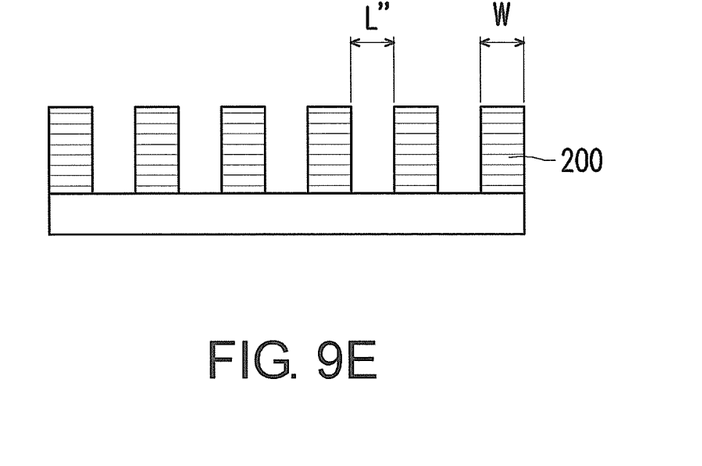

Finally, as shown in FIG. 9E, the hard mask 210 is removed to obtain the patterned processed layer 200. The processed layer 200 has a width W. In the present embodiment, the width W equal to the width $W_{HM}$, such that the width W is slightly less than the width $W_{SP}$, and an interval L" between the hard masks 210 is slightly greater than the interval L' between the spacer layers shown in FIG. 9B.

As described above, according to the present embodiment, a gate structure of the memory cell with short channel may be obtained by using the double patterning technique, such that the memory cell with a line width that exceeds a resolution limit in a photolithography step may be formed. Therefore, the memory array integrated in high density may be formed and an area occupied by the memory array may be reduced.

In an embodiment, the spacer layers SP and the underlayer film 220 are removed to expose the hard mask 210 after the step shown in FIG. 9C, but the invention is not limited thereto. In the state of FIG. 9C, the spacer layers SP may also be used together as the mask for etching the processed layer 200.

Further, as described above, the memory array of the present embodiment has the asymmetric structure. The following methods may be used when fondling the asymmetric structure by using the double patterning technique. In the double patterning technique, the spacer layers SP formed on sidewalls at two sides of photoresist patterns may be used to form the hard mask. Therefore, an amount of the hard mask eventually formed is a multiple of 2. Accordingly, as shown in FIG. 6, in the circumstance where one NAND string includes eight memory cells (eight word lines WL0 to WL7), nine hard masks may be formed by using the double patterning technique. Then, one hard mask at one end portion side is removed. As such, the interval S4 of the word line WL0 and the select gate line SGS may be sufficiently larger than the interval S1 of the word line WL7 and the select gate line SGD.

Further, in other methods which are different from the above, eight hard masks may be formed by using the double patterning technique, but a positioning is further performed in a manner of the interval S4 of the hard mask formed on one end portion and the select gate line SGS being greater than the interval S1 of the hard mask formed on another end portion and the select gate line SGD.

Figure 10A:
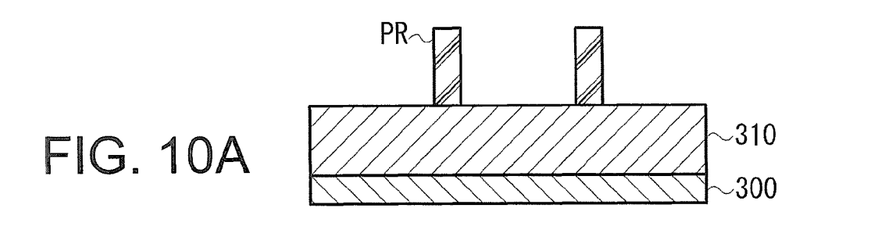
FIG. 10A to FIG. 10E are diagrams illustrating a manufacturing method of an asymmetric memory array according to a fourth embodiment of the invention.
Figure 10B:
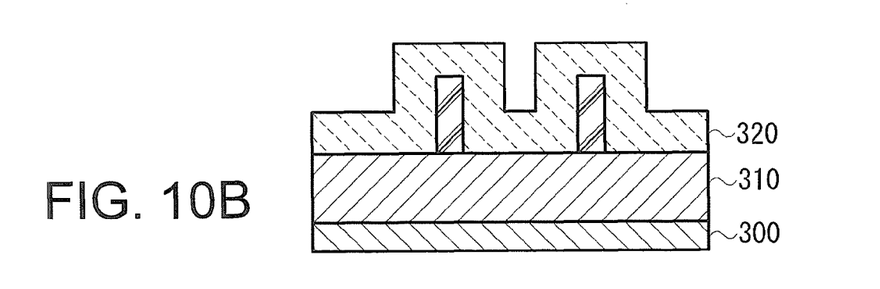
Figure 10C:
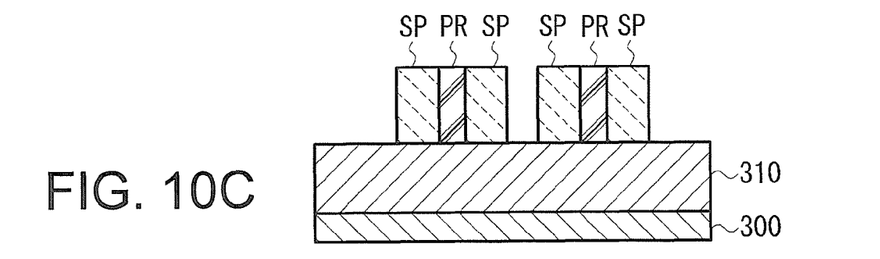
Figure 10D:
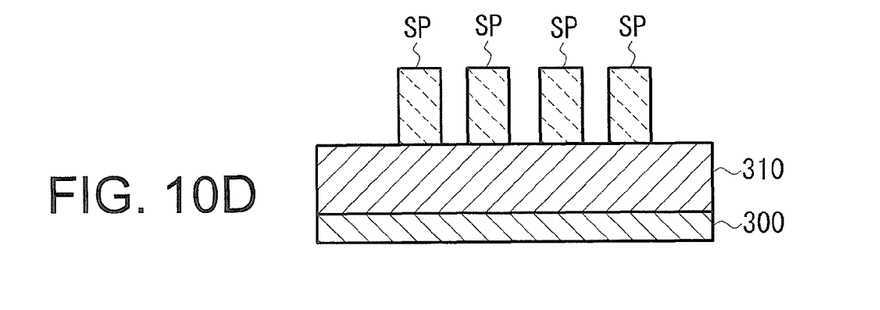
Figure 10E:
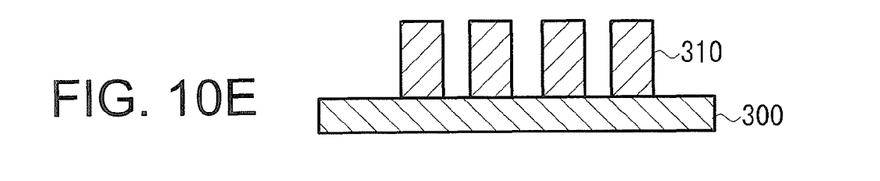

Next, a manufacturing method of a memory array with an asymmetric structure according to a fourth embodiment of the invention is illustrated in FIG. 10A to FIG. 10E. As shown in FIG. 10A, a processed layer 310 is formed on an underlayer film 300, and photoresist patterns PR are formed on the processed layer 310 through the photolithography step. Next, after an insulation film 320 with a fixed film thickness is formed on the entire surface as shown in FIG. 10B, the insulation film 320 is proceeded with an etch back process to form the spacer layers SP on sidewalls at two sides of the photoresist patterns PR as shown in FIG. 10C. Next, as shown in FIG. 10D, the photoresist patterns PR are removed through methods such as ashing so that the spacer layers SP are formed. Next, as shown in FIG. 10E, the spacer layers SP are used as a mask to etch the processed layer 310.

As such, according to the present embodiment, mask patterns for the spacer layers SP may be formed in self-alignment by using one photolithography step. Accordingly, by properly adjusting the width $W_{PR}$ and the interval L of the photoresist patterns PR and the width W of the spacer layers SP (which can be adjusted through adjustment for a growing film thickness of the insulation film), the mask pattern for the spacer layer SP having an interval smaller than the interval (spacing) of the photoresist patterns PR (e.g., ½ the interval) may be formed accordingly.

Figure 11A:
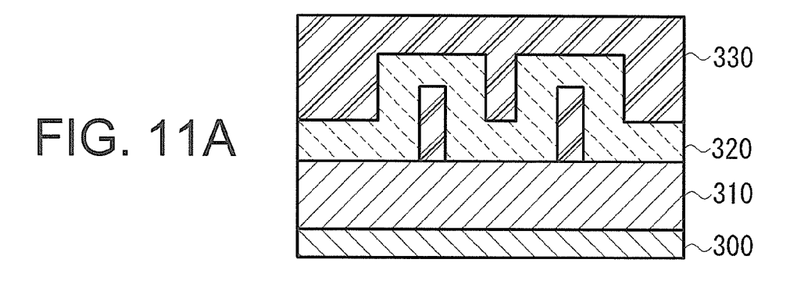
FIG. 11A to FIG. 11D are diagrams illustrating another manufacturing method of the asymmetric memory array according to the fourth embodiment of the invention.
Figure 11B:
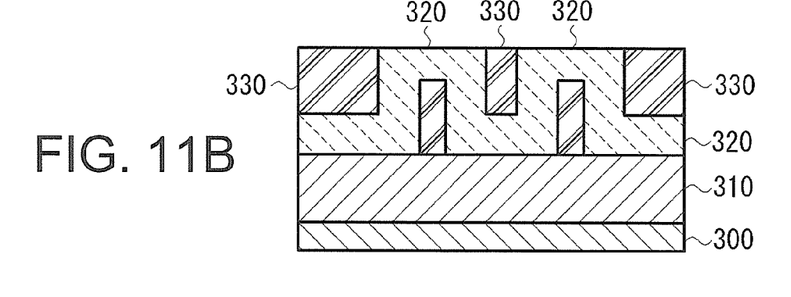
Figure 11C:
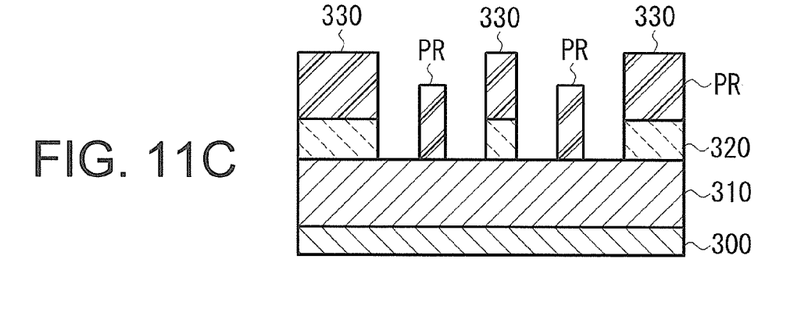
Figure 11D:
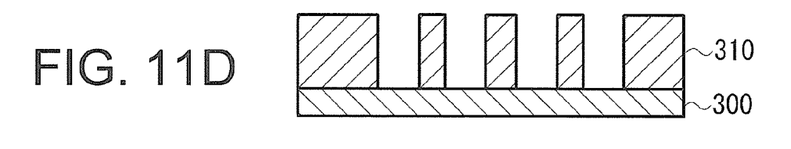

Next, a modification of the fourth embodiment is illustrated in FIG. 11A to FIG. 11D. After the steps of FIG. 10A and FIG. 10B are performed, photoresist patterns 330 with a fixed film thickness are formed on the entire surface as shown in FIG. 11A. Next, as shown in FIG. 11B, the photoresist patterns 330 are etched back for flattening the photoresist patterns 330 remained on sidewalls at two sides of the insulation film 320. Next, as shown in FIG. 11C, the exposed insulation film 320 is removed by an anisotropic etching with selectivities. Accordingly, the photoresist patterns 330 are formed between the photoresist patterns PR. Next, as shown in FIG. 11D, the photoresist patterns PR, 330 are used for etching the processed layer 310. Thereafter, the photoresist patterns PR, 330 are removed by method such as aching. As a result, a pattern inverted from the pattern of FIG. 10E is formed.

In the fourth embodiments, the memory cell array with narrow interval and short channel as similar to that of the third embodiment may also be formed. Furthermore, as similar to the third embodiment, the interval S4 of the word line WL0 and the select gate line SGS is made to be greater than the interval S1 of the word line WL7 and the select gate line SGD. As such, one hard mask needlessly formed on one end portion may be removed, or the positioning may be performed in a manner of a location where the hard mask is formed on one end portion being away from the select gate line SGS by an interval of S4.

The preferable embodiments of the invention had been described in detail above, but the invention is not limited to a specific embodiment. It will be apparent to those skilled in the art that various modifications and variations can be made to the structure of the present invention without departing from the scope or spirit of the invention.

Although the embodiments illustrate the relation of the intervals being S1=S3 and S4=2×S1, such example is only illustrative and the invention is not limited to such relation. Moreover, although the embodiments illustrate that the example of eight NAND strings in one block and one string having eight memory cells, such example is only illustrative and the invention is not limited thereto.

What is claimed is:

1. A semiconductor memory device, comprising a memory array, and the memory array comprising:
   a plurality of NAND type strings, wherein each of the strings comprises: a plurality of memory cells connected in series; a bit line select transistor, connected to one end portion of the memory cells connected in series; and a source line select transistor, connected to another end portion of the memory cells connected in series;
   a plurality of word lines, connected to a plurality of gates of the memory cells in row direction of the strings;
   a first select gate line, connected to a plurality of gates of the source line select transistors in row direction of the strings; and
   a second select gate line, connected to a plurality of gates of the bit line select transistors in row direction of the strings;
   wherein in any one string among the strings, a first interval is greater than a second interval, the first interval is an interval between the gate of the source line select transistor and the gate of the memory cell of the word line adjacent thereto, and the second interval is an interval between the gate of the bit line select transistor and the gate of the memory cell of the word line adjacent thereto,
   wherein during a programming action, whether the word line adjacent to the second select gate line is a selected page is determined, when determining that the word line is the selected page, a first voltage is applied to the second select gate line so that the bit line select transistors are turned on, when determining that the word line is not the selected page, a second voltage is applied to the second select gate line so that the bit line select transistors are turned on, and the first voltage is greater than the second voltage.

2. The semiconductor memory device according to claim 1, wherein
   the first interval is greater than a third interval between the adjacent two gates of the memory cells in the same string.

3. The semiconductor memory device according to claim 2, wherein
   the first interval is a double of the second interval, and the second interval is equal to the third interval.

4. The semiconductor memory device according to claim 1, wherein during a programming action, a voltage for turning off the source line select transistor is applied to the first select gate line.

5. The semiconductor memory device according to claim 2, wherein during a programming action, a voltage for turning off the source line select transistor is applied to the first select gate line.

* * * * *